US012652968B2

(12) United States Patent
Song et al.

(10) Patent No.: US 12,652,968 B2
(45) Date of Patent: Jun. 9, 2026

(54) SEMICONDUCTOR DEVICE

(71) Applicant: SK hynix Inc., Icheon-si (KR)

(72) Inventors: Jeong Hwan Song, Icheon-si (KR); Tae Jung Ha, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 543 days.

(21) Appl. No.: 17/992,782

(22) Filed: Nov. 22, 2022

(65) Prior Publication Data

US 2023/0413693 A1    Dec. 21, 2023

(51) Int. Cl.
*H10N 70/00* (2023.01)
*H10B 63/10* (2023.01)
*H10W 20/41* (2026.01)

(52) U.S. Cl.
CPC ........... *H10N 70/821* (2023.02); *H10B 63/10* (2023.02); *H10N 70/883* (2023.02); *H10W 20/435* (2026.01)

(58) Field of Classification Search
CPC ....... H10B 63/20; H10B 63/80; H10B 63/845
See application file for complete search history.

(56) References Cited

U.S. PATENT DOCUMENTS

| | | | | |
|---|---|---|---|---|
| 11,037,984 | B1 * | 6/2021 | Song | H10N 70/24 |
| 2013/0256625 | A1 * | 10/2013 | Lee | H10N 70/801 |
| | | | | 257/5 |
| 2019/0214559 | A1 * | 7/2019 | Clarke | H10B 63/30 |
| 2023/0134437 | A1 * | 5/2023 | Nardi | G11C 11/5628 |
| | | | | 365/189.011 |

FOREIGN PATENT DOCUMENTS

| | | |
|---|---|---|
| KR | 20170137562 A | 12/2017 |
| KR | 20200086410 A | 7/2020 |

* cited by examiner

*Primary Examiner* — Shih Tsun A Chou
(74) *Attorney, Agent, or Firm* — Perkins Coie LLP

(57) ABSTRACT
A semiconductor device may include: a plurality of first conductive lines extending in a first direction; a plurality of second conductive lines spaced apart from the first conductive lines and extending in a second direction intersecting the first direction; and a plurality of memory cells respectively disposed to overlap intersection regions of the plurality of the first conductive lines and the plurality of the second conductive lines; and a layer structured to include an insulating material containing metal ions and formed between each memory cell and at least one of a first conductive line and a second conductive line that intersects with each other at a memory cell.

18 Claims, 4 Drawing Sheets

130, 140

110 second direction first direction

SEMICONDUCTOR DEVICE

PRIORITY CLAIM AND CROSS-REFERENCE TO RELATED APPLICATION

This application claims priority under 35 U.S.C. § 119 to Korean Patent Application No. 10-2022-0074025 filed on Jun. 17, 2022, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

In an embodiment, a semiconductor device may include: a plurality of first conductive lines extending in a first direction; a plurality of second conductive lines spaced apart from the first conductive lines and extending in a second direction intersecting the first direction; and a plurality of memory cells respectively disposed to overlap intersection regions of the plurality of the first conductive lines and the plurality of the second conductive lines; and a layer structured to include an insulating material containing metal ions and formed between each memory cell and at least one of a first conductive line and a second conductive line that intersects with each other at a memory cell.

In another embodiment, a semiconductor device may include: a plurality of first conductive lines extending in a first direction; a plurality of second conductive lines spaced apart from the first conductive lines and extending in a second direction intersecting the first direction; a plurality of memory cells respectively disposed at intersection regions of the first conductive lines and the second conductive lines; and a layer disposed between any one of the plurality of the memory cells and at least one of a first conductive line and a second conductive line, wherein the layer connected to a first memory cell among the plurality of the memory cells has a first state in which the layer has an insulating portion and a conductive portion that are stacked, and wherein the layer connected to a second memory cell among the plurality of the memory cells has a second, electrically conductive state.

DETAILED DESCRIPTION

Figure 1:
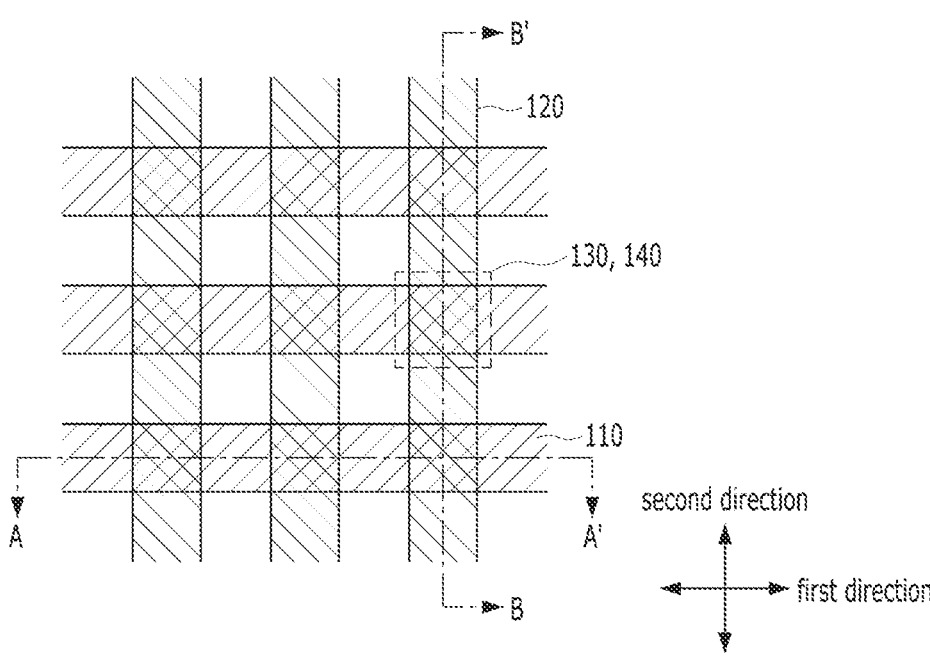
FIGS. 1 and 2 are views illustrating a semiconductor device according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
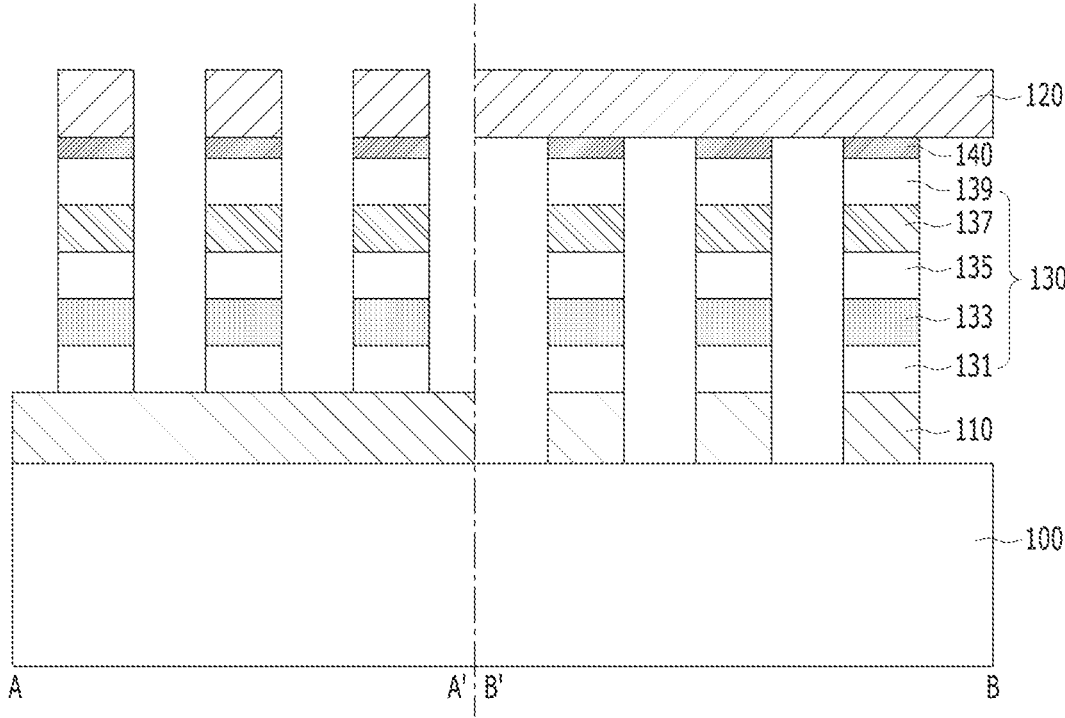

FIGS. 1 and 2 are views illustrating a semiconductor device according to an embodiment of the present disclosure. FIG. 1 is a plan view, and FIG. 2 is a cross-sectional view taken along lines A-A' and B-B' of FIG. 1.

Referring to FIGS. 1 and 2, the semiconductor device according to the present embodiment may include a substrate 100, a plurality of first conductive lines 110 formed over the substrate 100 and extending in a first direction, a plurality of second conductive lines 120 formed over first conductive lines 110 to be spaced apart from the first conductive lines 110 and extending in a second direction intersecting the first direction, a plurality of memory cells 130 respectively overlapping intersection regions of the first conductive lines 110 and the second conductive lines 120 between the first conductive lines 110 and the second conductive lines 120, and a special layer 140 ("an open layer 140") interposed between the memory cell 130 and the second conductive line 120 that can change its state of electrical conductivity to be either electrically conductive or an open circuit depending on a voltage or current applied to the layer 140.

The substrate 100 may include a semiconductor material such as silicon. A desired lower structure (not shown) may be formed in the substrate 100. For example, the substrate 100 may include a driving circuit (not shown) electrically connected to the first conductive line 110 and/or the second conductive line 120 to control them.

The first conductive line 110 and the second conductive line 120 may include at least one of various conductive materials, for example, a metal such as platinum (Pt), tungsten (W), aluminum (Al), copper (Cu), or tantalum (Ta), a metal nitride such as tantalum nitride (TaN) or titanium nitride (TiN), or a combination thereof, and may have a single-layer structure or a multi-layer structure. The first conductive line 110 and the second conductive line 120 may be respectively connected to a lower and an upper end of the memory cell 130 to transmit a voltage or current to the memory cell 130 to drive the memory cell 130. When the first conductive line 110 functions as a word line, the second conductive line 120 may function as a bit line. Conversely, when the first conductive line 110 functions as a bit line, the second conductive line 120 may function as a word line.

The memory cell 130 may include a variable resistance element that stores different data by being in different resistance states and by switching between the different resistance states according to a voltage or current applied through the first conductive line 110 and the second conductive line 120. In a plan view of an example of the memory cell 130, the memory cell 130 may be in various suitable shapes including, for example, a rectangular shape in which both sidewalls in the first direction are aligned with the second conductive line 120, and both sidewalls in the second direction are aligned with the first conductive line 110. However, other implementations are also possible as long as the memory cell 130 overlaps each of the intersection regions of the first conductive lines 110 and the second conductive lines 120. The planar shape of the memory cell 130 may be variously modified.

In an example, the memory cell 130 may include a stacked structure of a lower electrode layer 131, a selector layer 133, an intermediate electrode layer 135, a variable resistance layer 137, and an upper electrode layer 139.

The lower electrode layer 131 may be interposed between the first conductive line 110 and the selector layer 133, and may function to electrically connect the first conductive line 110 and the selector layer 133 while physically separating the first conductive line 110 from the selector layer 133. The intermediate electrode layer 135 may be interposed between the selector layer 133 and the variable resistance layer 137 to electrically connect the selector layer 133 and the variable resistance layer 137 while physically separating the selector layer 133 from the variable resistance layer 137. The upper electrode layer 139 may be interposed between the variable resistance layer 137 and the second conductive line 120, and may function to electrically connect the variable resistance layer 137 and the second conductive line 120 while physically separating the variable resistance layer 137 from the second conductive line 120. At least one of the lower electrode layer 131, the intermediate electrode layer 135, or the upper electrode layer 139 may include at least one of various conductive materials, for example, a metal such as platinum (Pt), tungsten (W), aluminum (Al), copper (Cu), or tantalum (Ta), a metal nitride such as tantalum nitride (TaN) or titanium nitride (TiN), or a combination thereof. Alternatively, at least one of the lower electrode layer 131, the intermediate electrode layer 135, or the upper electrode layer 139 may include a carbon layer.

The selector layer 133 may function to prevent or reduce current leakage which may occur between the memory cells 130 sharing the first conductive line 110 or the second conductive line 120. To this end, the selector layer 133 may have a threshold switching characteristic, for example, a characteristic for blocking or substantially limiting current when a magnitude of an applied voltage is less than a predetermined threshold value and for allowing current to abruptly increase above the threshold value. The threshold value may be referred to as a threshold voltage, and the selector layer 133 may be implemented in a turned-on state or a turned-off state based on the threshold voltage. For example, the selector layer 133 may be turned on to be electrically conductive to allow the current to follow through when the magnitude of the applied voltage is greater than the threshold value and may be turned off to block or substantially limit current when the magnitude of the applied voltage is less than the threshold value. The selector layer 133 may include a diode, an ovonic threshold switching (OTS) material such as a chalcogenide-based material, a mixed ionic electronic conducting (MIEC) material such as a metal-containing chalcogenide-based material, a metal insulator transition (MIT) material such as $NbO_2$, $VO_2$, or others, or a tunneling insulating layer having a relatively wide band gap, such as $SiO_2$, $Al_2O_3$, or others.

The variable resistance layer 137 may operate to store data in the memory cell 130. To this end, the variable resistance layer 137 may have a variable resistance characteristic that switches between different resistance states according to an applied voltage. The variable resistance layer 137 may have a single-layer structure or a multi-layer structure including at least one of materials used for an RRAM, a PRAM, an MRAM, an FRAM, or others, for example, a metal oxide such as a perovskite-based oxide or a transition metal oxide, a phase change material such as a chalcogenide-based material, a ferromagnetic material, a ferroelectric material, or others.

In various implementations of the disclosed technology, the structure of the memory cell 130 may be variously modified. As an example, at least one of the lower electrode layer 131, the intermediate electrode layer 135, the upper electrode layer 139, and the selector layer 133 may be omitted. Alternatively, as an example, the memory cell 130 may further include one or more layers, in addition to the above layers 131, 133, 135, 137, and 139, to improve characteristics of the memory cell 130. Alternatively, as an example, the upper and lower positions of the variable resistance layer 137 and the selector layer 133 may be reversed with each other.

Alternatively, as an example, the memory cell 130 may have a structure in which a layer simultaneously performing a function as a memory layer and a function as a selector layer is interposed between the lower electrode layer 131 and the upper electrode layer 139, and thus, the memory cell 130 may function as a self-selecting memory cell.

A space between the first conductive lines 110, between the second conductive lines 120, and between the memory cells 130 may be filled with an insulating material (not shown).

In some circumstances, a short failure of a memory cell can occur when an excessive current, which may be referred to as an overshooting current or a spike current, unexpectedly flows through the memory cell 130. For convenience of description, the memory cell 130 in which the short failure has occurred will be referred to as a defective memory cell, and the memory cell 130 in which the short failure did not occur will be referred to as a normal memory cell. Since the defective memory cell 130 allows the supplied current to pass through the defective memory cell 130, the defective memory cell cannot operate normally.

Since the defective memory cell 130 can provide a path for the current leaking, when the semiconductor device has the defective memory cell 130, the leakage current in the entire semiconductor device increase, which disturbs the operation of the normal memory cell 130. This is because, when the leakage current increases, more current is required for driving of the normal memory cell 130.

In the present embodiment, even if there is the defective memory cell 130, the current flowing through the defective memory cell 130 may be blocked and/or reduced, and thus, an increase in the leakage current in the semiconductor device can be prevented. In the present embodiment, the open layer 140 interposed between each memory cell 130 and a corresponding second conductive line 120 is proposed.

The open layer 140 may be formed over each of the memory cells 130. In a plan view, the open layer 140 may be disposed to overlap each of the memory cells 130 and can respond to the applied voltage or current to be in an electrically conducting state or a non-conducting state (or an open circuit state). As an example, the open layer 140 may have a sidewall aligned with a sidewall of the memory cell 130 by being patterned together with the memory cell 130. However, the present disclosure is not limited thereto, and the open layer 140 may have an island shape overlapping each of the memory cells 130, and may have a sidewall that is at least partially not aligned with the sidewall of the memory cell 130. Also, the planar shape of the open layer 140 may be variously modified.

In the implementations of the disclosed technology, the open layer 140 may be in the first sate (which may be referred to as an electrically conductive state) or the second state (which may be referred to as an open state) depending on whether the voltage or current applied to the open layer 140 exceeds a predetermined threshold value or not. When the voltage or current applied to the open layer 140 does not exceed the predetermined threshold value, the open layer 140 may have an electrically conductive characteristic and electrically connect the memory cell 130 and the second conductive line 120 by being disposed between the memory cell 130 and the second conductive line 120. When the voltage or current applied to the open layer 140 through the first and second conductive lines 110 and 120 exceeds the predetermined threshold value, the open layer 140 may lose its conductivity and block the electrical connection between the memory cell 130 and the second conductive line 120. When the open layer 140 loses its connectivity and blocks the electrical connection between the memory cell 130 and the second conductive line 120, the open layer 140 creates an open circuit condition at the layer 140 and thus may be referred to be in an open state. In some implementations, the open layer 140 may include an insulating material containing metal ions such that the current flows due the presence of the metal ions. When the voltage or current applied to the open layer 140 is greater than the predetermined threshold value, the open state of the open layer 140 can be achieved by creating an insulating portion including only the insulating material due to the movement of the metal ions. When the insulating portion is formed in the open layer 140, the electrical connection between the memory cell 130 and the second conductive line 120 is cut off, so that the flow of current through the defective memory cell 130 may be blocked. This will be described in more detail below with reference to FIGS. 3A to 3D.

FIGS. 3A to 3D are example diagrams illustrating states of the memory cell 130 and the open layer 140 of the semiconductor device of FIG. 2.

Figures 3A, 3B, 3C, 3D:
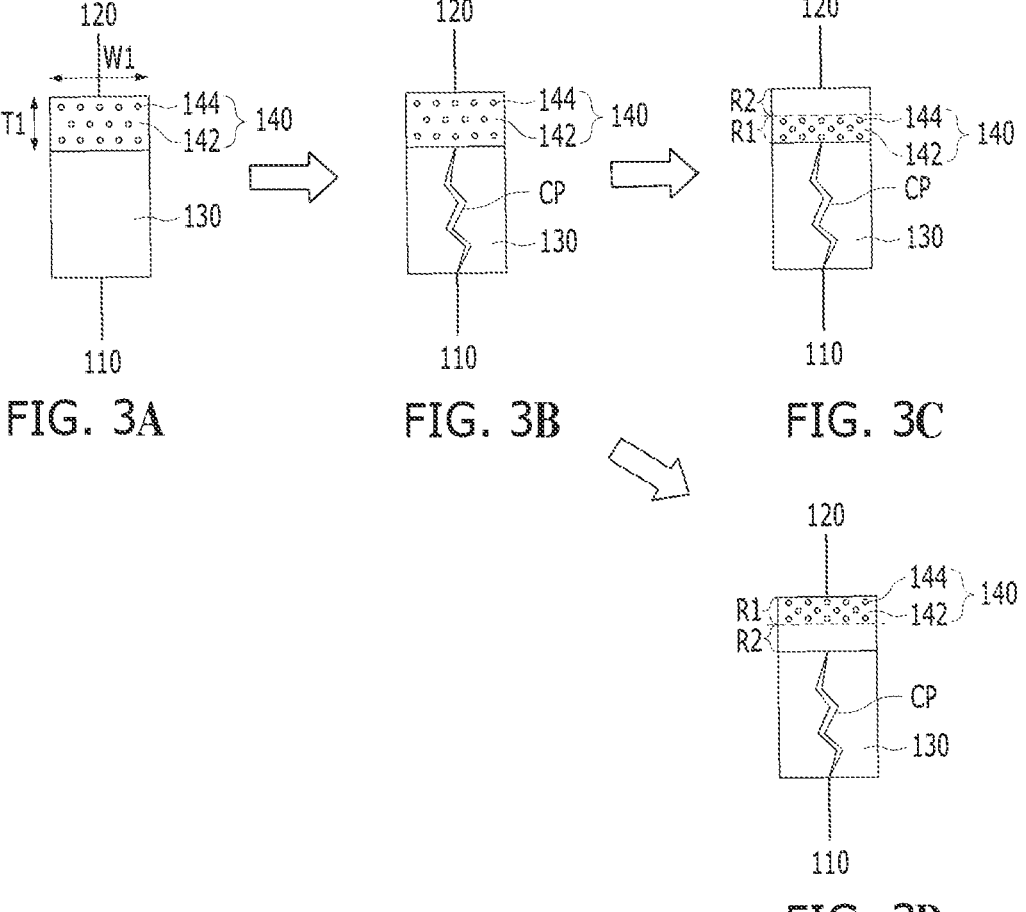
FIGS. 3A to 3D are example diagrams illustrating states of the memory cell 130 and the open layer 140 of the semiconductor device of FIG. 2.

FIG. 3A shows a case in which the open layer 140 that is not in the open state (thus, the conductive state) is disposed over the normal memory cell 130. For reference, the normal memory cell 130 may mean a memory cell in which a short failure did not occurred. When the open layer 140 is not in the open state, an insulating portion including the insulating material only without the metal ions may not be formed in the open layer 140. Thus, the open layer 140 may have a conductive characteristic and be in the conductive state.

The open layer 140 may include an insulating material 142 and metal ions 144 doped in the insulating material 142. The insulating material 142 may include silicon oxide, silicon nitride, metal oxide, metal nitride, or chalcogenide, or a combination thereof. The metal ions 144 may include Cu, Ag, Ni, Li, Fe, Au, Al, Mg, Zn, or Mn, or a combination thereof. When a voltage or current less than the predetermined threshold value is applied to the open layer 140, the metal ions 144 may not move in the insulating material 142, and when a voltage or current greater than or equal to the predetermined threshold value is applied to the open layer 140, the metal ions 144 may move within the insulating material 142 according to the polarity of the applied voltage or the direction of the applied current. In various implementations of the disclosed technology, the types of the insulating material 142 and the metal ion 144 may be appropriately selected to control the movement of the metal ions 144 based on the applied voltage or current and to control the states of the electrical conductivity of the open layer 140 to be either electrically conductive or be in an open circuit without electrical conductivity.

The metal ions 144 may be substantially uniformly distributed within the insulating material 142. In some implementations, the metal ions 144 may be substantially uniformly distributed in a direction of the thickness T1 of the open layer 140. In this case, since current flows through the metal ions 144 in the open layer 140, the open layer 140 has a conductive property. When an operating voltage or current is applied to the memory cell 130 through the first and second conductive lines 110 and 120, the conductive property of the open layer 140 may be substantially maintained. In this case, under the operating voltage or current of the memory cell 130, the metal ions 144 in the open layer 140 may not substantially migrate. As a result, the memory cell 130 may operate normally by applying various operating voltages or currents to the memory cell 130 through the first and second conductive lines 110 and 120. The operating voltage or current may mean a voltage or current applied during various operations such as a program operation for changing the resistance state of the memory cell 130 from a low resistance state to a high resistance state or from a high resistance state to a low resistance state, a read operation for reading the resistance state of the memory cell 130, or the like FIG. 3B shows a case in which the open layer 140 that is not in the open state is disposed over the memory cell 130 when the short failure occurs.

The open layer 140 may have a conductive property as in the case of FIG. 3A.

In the defective memory cell 130, a current path CP passing through the memory cell 130 to flow between the upper end and the lower end of the memory cell 130 may be generated. Since the current path CP is permanent, a program operation for changing the resistance state of the memory cell 130 cannot be performed normally even when the operating voltage or current is applied through the first and second conductive lines 110 and 120. This case may occur when an excessive current unexpectedly flows in the memory cell 130 of FIG. 3A. In the example of FIG. 3B, despite the excessive current that causes the short failure of the memory cell 130, an insulating portion including the insulating material only without the metal ions may not be formed in the open layer 140 so that a conductive property of the open layer 140 is maintained. This may be because the excessive current is smaller than a current sufficient to generate the insulating portion including the insulating material only without the metal ions in the open layer 140. In this case, since the open layer 140 has a conductive characteristic, a current may flow between the first conductive line 110 and the second conductive line 120 through the memory cell 130 and the open layer 140. Accordingly, during a read operation, the memory cell 130 may appear to be stuck in a low resistance state.

FIGS. 3(C) and 3(D) show a case in which the open layer 140 in the open state is disposed over the memory cell 130 in which the short failure occurs.

The open layer 140 in the open state may include an insulating portion R2 which contains the insulating material 142 only without the metal ions 144 due to the movement of the metal ions 144. Thus, the insulating portion R2 may not contain the metal ions 144. A remaining portion of the open layer 140, except for the insulating portion R2, will be referred to as a conductive portion R1. The conductive portion R1 may include the insulating material 142 and the metal ions 144. The concentration of the metal ions 144 in the conductive portion R1 may be greater than the concentration of the metal ions 144 in the open layer 140 that is not in the open state as in the case of FIG. 3A or FIG. 3B. This may be because the metal ions 144 are relatively densely present in the conductive portion R1.

The movement direction of the metal ions 144 may vary depending on the polarity of the voltage applied to the first conductive line 110 and the second conductive line 120, and accordingly, the relatively positions of the conductive portion R1 and the insulating portion R2 may be changed. For example, when a relatively positive voltage is applied to the second conductive line 120 compared to the first conductive line 110, as shown in FIG. 3C, the metal ions 144 may move in a direction away from the second conductive line 120, and thus, the conductive portion R1 may be disposed closer to the memory cell 130 than the insulating portion R2. Conversely, when a relatively negative voltage is applied to the second conductive line 120 compared to the first conductive line 110, as shown in FIG. 3D, the metal ions 144 may move in a direction closer to the second conductive line 120, and thus, the insulating portion R2 may be disposed closer to the memory cell 130 than the conductive portion R1. In any case, the open layer 140 may include the insulating portion R2 to block the electrical connection between the memory cell 130 and the second conductive line 120.

As described above, in the defective memory cell 130, the current path CP passing through the memory cell 130 and flowing between the upper end and the lower end of the memory cell 130 may be generated. Since the current path CP is permanent, the program operation for changing the resistance state of the memory cell 130 cannot be performed even when the operating voltage or current is applied through the first and second conductive lines 110 and 120. However, since the open layer 140 includes the insulating portion R2, the open layer 140 may block current flow despite the short failure of the defective memory cell 130. As a result, current flow between the first conductive line 110 and the second conductive line 120 may be blocked. Thus, the memory cell 130 itself may be in a state in which a short failure occurs, but during operation of the memory cell 130, it may be recognized that the current flow in the memory cell 130 is blocked, that is, the memory cell 130 has the open state. Accordingly, during the read operation, the memory cell 130 may appear to be stuck in a high resistance state.

In one example, this case may occur when an unintentional excessive current flows through the memory cell 130 in the state of FIG. 3A, which causes the short failure of the memory cell 130, and at the same time, the insulating portion R2 is formed by the movement of the metal ions 144 in the open layer 140. This may be because the excessive current is equal to or greater than a current level that forms the insulating portion R2 in the open layer 140.

In another example, this case may occur when an additional voltage or current is applied to form the insulating portion R2 in the open layer 140 in the state of FIG. 3B. However, since the insulating portion R2 should not be formed in the open layer 140 during normal operation such as programming and reading of the memory cell 130, the magnitude of the additional voltage or current may be greater than the magnitude of the operating voltage or current. The additional voltage or current may include a plurality of pulses. Here, the width and/or magnitude of the pulse of the additional voltage or current may be greater than the width and/or magnitude of the pulse of the operating voltage or current.

According to the semiconductor device described above, it may be possible to prevent and/or reduce the leakage current by blocking and/or reducing the current flow through the memory cell 130 in which the short failure occurred by the open layer 140. As a result, since the leakage current does not adversely affect the normal operation of the memory cell 130, the operating characteristics of the semiconductor device can be improved.

In the above embodiment, the case has been described in which the open layer 140 is positioned between the second conductive line 120 and the memory cell 130, for example, over the memory cell 130, but the present disclosure is not limited thereto. The open layer 140 may be positioned between the first conductive line 110 and the memory cell 130, for example, under the memory cell 130. Alternatively, the open layer 140 may be positioned between the first conductive line 110 and the memory cell 130 and between the second conductive line 120 and the memory cell 130, for example, under and over the memory cell 130, respectively. This will be exemplarily described with reference to FIG. 4.

Figure 4:
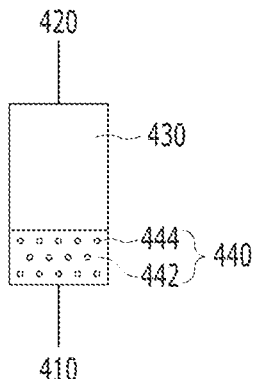
FIG. 4 is a view illustrating a semiconductor device according to another embodiment of the present disclosure.

FIG. 4 is a view illustrating a semiconductor device according to another embodiment of the present disclosure. FIG. 4 shows one memory cell 430, one open layer 440 connected to the memory cell 430, and a first conductive line 410 and a second conductive line 420 that are connected to the memory cell 430. Differences from the above-described embodiment will be mainly described.

Referring to FIG. 4, a stacked structure of an open layer 440 and a memory cell 430 may be interposed between the first conductive line 410 and the second conductive line 420. Thus, the open layer 440 may be positioned under the memory cell 430. The open layer 440 may include an insulating material 442 and a metal ions 444 doped in the insulating material 442.

When a short failure occurs in the memory cell 430, the open layer 440 connected to the memory cell 430 may have an insulating portion only without the metal ions 444 due to movement of the metal ions 444. As a result, the electrical connection between the memory cell 430 and the first conductive line 410 may be cut off, thereby preventing the current flow between the first conductive line 410 and the second conductive line 420 through the memory cell 430.

Figure 5:
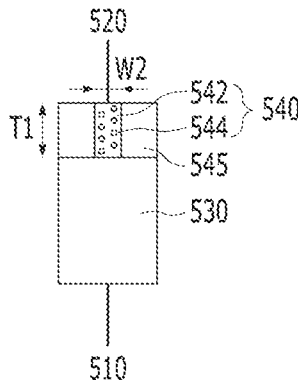
FIG. 5 is a view illustrating a semiconductor device according to another embodiment of the present disclosure.

FIG. 5 is a view illustrating a semiconductor device according to another embodiment of the present disclosure. FIG. 5 shows one memory cell 530, one open layer connected to the memory cell 530, and a first conductive line 510 and a second conductive line 520 that are connected to the memory cell 530. Differences from the above-described embodiments will be mainly described.

Referring to FIG. 5, a stacked structure of a memory cell 530 and an open layer 540 may be interposed between the first conductive line 510 and the second conductive line 520.

Here, the width W2 and/or the planar size of the open layer 540 may be smaller than the width and/or the planar size of the memory cell 530. This width W2 may be smaller than the width (refer to W1 of FIGS. 3A to 3D) of the open layer of the above-described embodiment. In this case, an insulating portion may be formed in the open layer 540 even under a current smaller than a current of the above-described embodiment.

A sidewall of the open layer 540 may be surrounded by an insulating layer 545. The insulating layer 545 may include various insulating materials such as silicon oxide, silicon nitride, metal oxide, or metal nitride, or a combination thereof.

The open layer 540 may be formed separately from the memory cell 530, for example, by patterning the open layer 540 using a mask different from the mask for forming the memory cell 530.

Alternatively, after the open layer 540 is patterned together with the memory cell 530, the open layer 540 may be partially oxidized or nitrified from the sidewall of the open layer 540 while protecting the sidewall of the memory cell 530 to form the insulating layer 545. In this case, the insulating layer 545 on the sidewall of the open layer 540 may include an oxide, nitride, or oxynitride of a metal that is same as a metal of the metal ions of the open layer 540.

Figure 6:
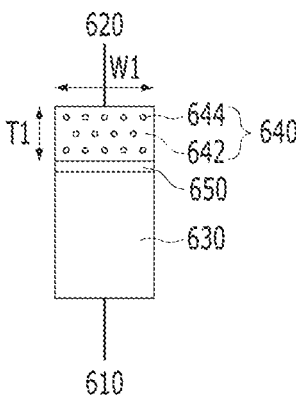
FIG. 6 is a view illustrating a semiconductor device according to another embodiment of the present disclosure.

FIG. 6 is a view illustrating a semiconductor device according to another embodiment of the present disclosure. FIG. 6 shows one memory cell 630, one open layer connected to the memory cell 630, and a first conductive line 610 and a second conductive line 620 that are connected to the memory cell 630. Differences from the above-described embodiments will be mainly described.

Referring to FIG. 6, a stacked structure of a memory cell 630 and an open layer 640 may be interposed between the first conductive line 610 and the second conductive line 620. Furthermore, a diffusion barrier layer 650 may be further interposed between the memory cell 630 and the open layer 640.

The diffusion barrier layer 650 may prevent the metal ions of the open layer 640 from diffusing into the memory cell 630. The diffusion barrier layer 650 may have a thickness to prevent diffusion of the metal ions while having a conductive property. As an example, the diffusion barrier layer 650 may include a metal nitride such as titanium nitride, tantalum nitride, or the like.

Although not shown, as in the case of FIG. 4, when the open layer is interposed between the first conductive line and the memory cell, the diffusion barrier layer may be disposed between the open layer and the memory cell, for example, under the memory cell.

Alternatively, although not shown, when the open layer is interposed between the first conductive line and the memory cell and between the second conductive line and the memory cell, the diffusion barrier layer is formed between each of the two open layers and the memory cell, for example, over and under the memory cell.

Figure 7:
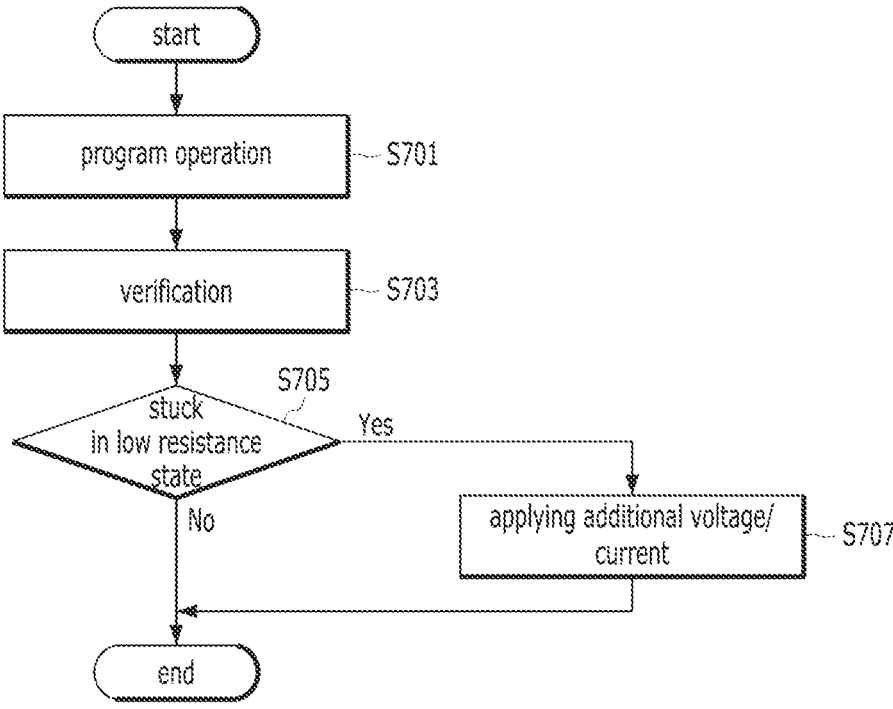
FIG. 7 is a flowchart illustrating a method of operating a semiconductor device according to an embodiment of the present disclosure.

FIG. 7 is a flowchart illustrating a method of operating a semiconductor device according to an embodiment of the present disclosure.

Referring to FIG. 7, in step S701, a program operation for changing the resistance state of a selected memory cell may be performed.

Next, in step S703, it may be verified whether the program operation of the selected memory cell is normally performed. The verification may be performed by applying a read voltage to the memory cell.

When the memory cell operates normally as shown in FIG. 3A, the program operation can be performed normally. In another example, even if the memory cell is not normally programmed, if the memory cell appears stuck in a high resistance state, for example, in the state as shown in FIG. 3C or FIG. 3D, there will be no current leakage path formed through the memory cell. The memory cell which is stuck in the high resistance state as shown in FIG. 3C or 3D does not become a path for current leakage. In another example, when the memory cell is not normally programmed and appears to be stuck in a low resistance state as shown in FIG. 3B, the memory cell becomes a path for current leakage. In this case, the additional steps S705 and S707 may be performed.

As a result of the verification in step S703 and the determination in step S705, when the memory cell is stuck in the low resistance state, an additional voltage or current may be applied to the memory cell in step 707. This additional voltage or current may have a magnitude to enable formation of an insulating portion in an open layer that overlaps and connects with the memory cell. The open layer can be disposed above or below the memory cell. Furthermore, the magnitude of the additional voltage or current may be greater than the magnitude of the program voltage or current during the program operation. As a result, the memory cell may be stuck in the high resistance state.

As a result of the verification in step S703 and the determination in step S705, when the memory cell is normally programmed or stuck in the high resistance state, the operation may be terminated.

According to the above embodiments of the present disclosure, it may be possible to improve the operating characteristics of the semiconductor device.

Although various embodiments have been described for illustrative purposes, it will be apparent to those skilled in the art that various changes and modifications may be made based on what is disclosed in this patent document.

What is claimed is:

1. A semiconductor device, comprising:
   a plurality of first conductive lines extending in a first direction;
   a plurality of second conductive lines spaced apart from the plurality of first conductive lines and extending in a second direction intersecting the first direction;
   a plurality of memory cells respectively disposed to overlap intersection regions of the plurality of first conductive lines and the plurality of second conductive lines;
   a layer structured to include an insulating material containing metal ions and formed between each of the plurality of memory cells and each of the plurality of first conductive lines or between each of the plurality of memory cells and each of the plurality of second conductive lines, wherein a width of the layer is smaller than a width of a memory cell of the plurality of memory cells; and
   an insulating layer surrounding a sidewall of the layer and formed between each of the plurality of memory cells and each of the plurality of first conductive lines or between each of the plurality of memory cells and each of the plurality of second conductive lines so as not to surround a sidewall of each of the plurality of memory cells.

2. The semiconductor device according to claim 1, wherein the layer is structured to exhibit a first state in which current flows by the metal ions, or a second state in which an insulating portion is formed by movement of the metal ions, according to a voltage or a current supplied through a first conductive line of the plurality of first conductive lines and a second conductive line of the plurality of second conductive lines.

3. The semiconductor device according to claim 2, wherein the layer having the second state includes the insulating portion free of the metal ions and a conductive portion including the insulating material and the metal ions.

4. The semiconductor device according to claim 3, wherein a concentration of the metal ions of the conductive portion is greater than a concentration of the metal ions of the layer having the first state.

5. The semiconductor device according to claim 3, wherein the conductive portion is closer to the memory cell than the insulating portion.

6. The semiconductor device according to claim 3, wherein the insulating portion is closer to the memory cell than the conductive portion.

7. The semiconductor device according to claim 2, wherein the layer connected to a defective memory cell among the plurality of memory cells has the second state.

8. The semiconductor device according to claim 7, wherein the layer having the second state is configured to block an electrical connection between the defective memory cell and at least one of the first conductive line and the second conductive line.

9. The semiconductor device according to claim 2, wherein the layer connected to a normal memory among the plurality of memory cells has the first state.

10. The semiconductor device according to claim 9, wherein the layer having the first state is configured to provide an electrical connection between a normal memory cell and at least one of the first conductive line and the second conductive line.

11. The semiconductor device according to claim 2, wherein the layer has the second state in response to the voltage or the current that has a magnitude greater than a magnitude of an operating voltage or current of the memory cell.

12. The semiconductor device according to claim 1, wherein the metal ions are movable in the insulating material according to a voltage or current supplied through a first conductive line of the plurality of first conductive lines and a second conductive line of the plurality of second conductive lines.

13. The semiconductor device according to claim 1, wherein the metal ions do not move in the insulating material when a voltage or current supplied through a first conductive line of the plurality of first conductive lines and a second conductive line of the plurality of second conductive lines has a magnitude equal to or less than a magnitude of an operating voltage or current of the memory cell, and the metal ions move in the insulating material when the voltage or current supplied through the first conductive line and the second conductive line has a magnitude greater than the magnitude of the operating voltage or current of the memory cell.

14. The semiconductor device according to claim 1, wherein a sidewall of the layer is aligned with the sidewall of the memory cell.

15. The semiconductor device according to claim 1, wherein an outer sidewall of the insulating layer is aligned with the sidewall of the memory cell.

16. The semiconductor device according to claim 1, wherein the insulating layer includes an oxide, a nitride, or an oxynitride of a metal, where the metal is same as a metal of the metal ions.

17. A semiconductor device, comprising:
a plurality of first conductive lines extending in a first direction;
a plurality of second conductive lines spaced apart from the plurality of first conductive lines and extending in a second direction intersecting the first direction;
a plurality of memory cells respectively disposed to overlap intersection regions of the plurality of first conductive lines and the plurality of second conductive lines;
a layer structured to include an insulating material containing metal ions and formed between each of the plurality of memory cells and each of the plurality of first conductive lines or between each of the plurality of memory cells and each of the plurality of second conductive lines; and
a diffusion barrier layer interposed between the layer and a memory cell of the plurality of memory cells and configured to prevent or reduce diffusion of the metal ions of the layer into the memory cell.

18. A semiconductor device, comprising:
a plurality of first conductive lines extending in a first direction;
a plurality of second conductive lines spaced apart from the plurality of first conductive lines and extending in a second direction intersecting the first direction;
a plurality of memory cells respectively disposed to overlap intersection regions of the plurality of first conductive lines and the plurality of second conductive lines; and
a layer structured to include an insulating material containing metal ions and formed between each of the plurality of memory cells and each of the plurality of first conductive lines or between each of the plurality of memory cells and each of the plurality of second conductive lines,
wherein the layer is structured to exhibit a first state in which current flows by the metal ions, or a second state in which an insulating portion is formed by movement of the metal ions, according to a voltage or a current supplied through a first conductive line of the plurality of first conductive lines and a second conductive line of the plurality of second conductive lines, and wherein the layer has the second state in response to the voltage or the current that has a width greater than a width of a pulse of an operating voltage or current of a memory cell of the plurality of memory cells.

* * * * *